United States Patent
Hayashi et al.

(10) Patent No.: US 11,348,998 B1
(45) Date of Patent: May 31, 2022

(54) RECONFIGURABLE GRAPHENE DEVICES VIA ELECTRICAL DOUBLE LAYER GATING

(71) Applicant: United States of America as respresented by the Secretary of the Navy, San Diego, CA (US)

(72) Inventors: Cody K. Hayashi, Waipahu, HI (US); Richard C. Ordonez, Miliani, HI (US); David G. Garmire, Ann Arbor, MI (US); Lewis Hsu, Honolulu, HI (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/222,400

(22) Filed: Apr. 5, 2021

(51) Int. Cl.
*H01L 29/06* (2006.01)
*H01G 7/06* (2006.01)
*H01G 4/04* (2006.01)
*H01L 29/16* (2006.01)

(52) U.S. Cl.
CPC ........... *H01L 29/0649* (2013.01); *H01G 4/04* (2013.01); *H01G 7/06* (2013.01); *H01L 29/1606* (2013.01)

(58) Field of Classification Search
CPC ............. H01L 29/0649; H01L 29/1646; H01L 29/66795; H01L 29/785; H01L 29/4238; H01G 4/04; H01G 7/06
USPC ............................ 257/401, 288; 438/284.286
See application file for complete search history.

(56) References Cited

U.S. PATENT DOCUMENTS 9,997,775 B1 * 6/2018 Ordonnez et al. ...... H01M 4/38
361/502

OTHER PUBLICATIONS

Ke Xu et al.: Electric-double-layer-gated transistors based on two-dimensional crystals: recent approaches and advances; J. Phys. Mater. 3 (2020).
Haiwei Du et al.; Electric double-layer transistors: a review of recent progress; J Mater Sci (2015).
Haifeng Ling; Electrolyte-gated transistors for synaptic electronics, neuromorphic computing, and ;adaptable biointerfacing; Appl. Phys. Rev. 7, 011307 (2020).
Z. L. Miskovic' et al.; Modeling Electrolytically Top-Gated Graphene; Nanoscale Res Lett (2010).
Graphenea; Technical Datasheet, Graphene Field-Effect Transistor Chip: S-20; Graphenea.com, available at https://www.graphenea.com/products/gfet-s20-for-sensing-applications, (believed to have been first posted in 2020).

(Continued)

*Primary Examiner* — Thinh T Nguyen
(74) *Attorney, Agent, or Firm* — Naval Information Warfare Center Pacific; Kyle Eppele; J. Eric Anderson (57) ABSTRACT

A method for using a graphene field-effect transistor (GFET) as a reconfigurable circuit, the method comprising the following steps: depositing a liquid dielectric over a graphene channel of the GFET; applying an activation energy via a first electric field across the liquid dielectric and the graphene channel to electrochemically produce chemical species within the liquid dielectric such that the chemical species accumulate at, and molecularly bond with, the graphene channel thereby decreasing a conductivity of the graphene channel; and applying a deactivation energy via a second electric field of opposite polarity to the first electric field to remove interaction between the chemical species and the graphene channel to increase the conductivity of the graphene channel.

20 Claims, 7 Drawing Sheets

(56) References Cited

OTHER PUBLICATIONS

Tim J. Echtermeyer et al.; Nonvolatile Switching in Graphene Field-Effect Devices; IEEE Electron Device Letters, vol. 29, No. 8, Aug. 2008.
M. Kettner et al.; Ionic gel as a gate dielectric for the easy characterization of graphene and polymer field-effect transistors and electrochemical resistance modification of graphene; J. Appl. Phys. 118, 025501 (2015).
Y. Li et al.; Review of memristor devices in neuromorphic computing: materials sciences and device challenges; Journal of Physics D: Applied Physics, vol. 51, No. 50, (2018).
S. Ali et al.; Flexible frequency selective passive circuits based on memristor and capacitor; Organic Electronics, vol. 51, (2017).

\* cited by examiner

RECONFIGURABLE GRAPHENE DEVICES VIA ELECTRICAL DOUBLE LAYER GATING

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, Calif., 92152; voice (619) 553-5118; ssc_pac_t2@navy.mil. Reference Navy Case Number 113081.

BACKGROUND OF THE INVENTION

The invention described herein relates to non-volatile computational electronics, such as graphene-based memristors. Memristors have shown great potential in overtaking traditional von Neumann architectures in which memory and computing are physically separated that results in added delays (long interconnects, capacitive coupling), as well as lower area density on chip. Current graphene-based electronics are limited in their switching capabilities (e.g., exhibiting ON-OFF ratios of <10). There is a need for a graphene-based memristor with improved performance characteristics.

SUMMARY

Described herein is a method for using a graphene field-effect transistor (GFET) as a reconfigurable circuit that comprising the following steps. One step provides for depositing a liquid dielectric over a graphene channel of the GFET. Another step provides for applying an activation energy via a first electric field across the liquid dielectric and the graphene channel to electrochemically produce chemical species within the liquid dielectric such that the chemical species accumulate at, and molecularly bond with, the graphene channel thereby decreasing a conductivity of the graphene channel. Another step provides for applying a deactivation energy via a second electric field of opposite polarity to the first electric field to remove interaction between the chemical species and the graphene channel to increase the conductivity of the graphene channel.

An embodiment of the method for providing a reconfigurable graphene circuit may be described as comprising the following steps. One step provides for depositing a liquid dielectric over a graphene channel of a GFET. Another step provides for applying a voltage bias across the liquid dielectric and the graphene channel that is sufficient to electrochemically produce ions within the liquid dielectric. Another step provides for continuing to apply the voltage bias for a period of time until an electrical double layer (EDL) at a graphene-dielectric interface is strong enough to separate the electrochemically-produced ions based on their polarity and to provide necessary molecular activation and deactivation energies to form weak, reversible molecular bonds between the produced ions and the graphene channel. Another step provides for using the reversible molecular bonds to dynamically set a degree of electrical conductance of the graphene channel such that the GFET exhibits ON-OFF ratios larger than $10^4$ with OFF-resistances as high as 10 MΩ. This enables reversible programming of the electrical conductance of the graphene channel.

An embodiment of the reconfigurable GFET may described as comprising a graphene channel, a liquid dielectric, and a gate electrode. The graphene channel is disposed between source and drain electrodes. The liquid dielectric is disposed on top of the graphene channel. The gate electrode is disposed on the liquid dielectric. A surface area of the gate electrode is at least as large as 75% of the surface area of the graphene channel such that when a controlled voltage bias is applied to the gate electrode electrochemical reactions are induced within the dielectric layer and portions of the graphene channel changing a majority of the graphene into an ion-bonded material and forming a uniform EDL at a graphene-dielectric interface.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed methods and circuits below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and circuits described herein as will be understood by one of ordinary skill in the art unless otherwise stated specifically.

References in the present disclosure to "one embodiment," "an embodiment," or any variation thereof, means that a particular element, feature, structure, or characteristic described in connection with the embodiments is included in at least one embodiment. The appearances of the phrases "in one embodiment," "in some embodiments," and "in other embodiments" in various places in the present disclosure are not necessarily all referring to the same embodiment or the same set of embodiments.

As used herein, the terms "comprises," "comprising," "includes," "including," "has," "having," or any variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of words such as "the," "a," or "an" are employed to describe elements and components of the embodiments herein; this is done merely for grammatical reasons and to conform to idiomatic English. This detailed description should be read to include one or at least one, and the singular also includes the plural unless it is clearly indicated otherwise.

Figure 1:
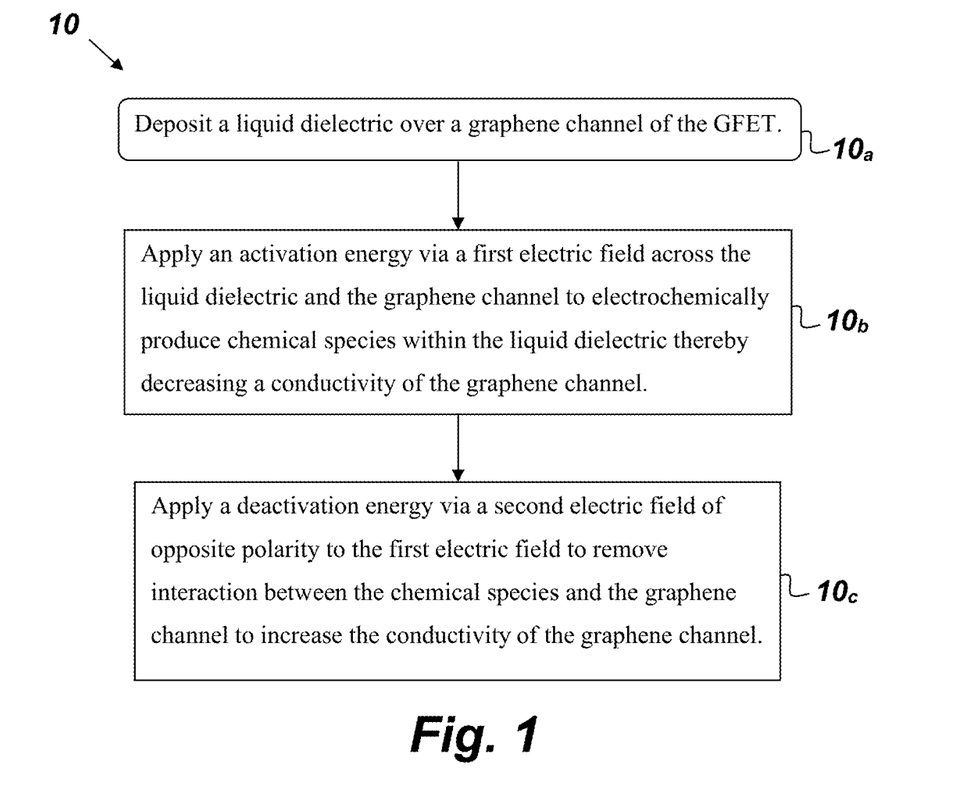
FIG. 1 is a flowchart of an embodiment of a method for using a GFET as a reconfigurable circuit.

FIG. 1 is a flowchart of an embodiment of method 10 for using a GFET as a reconfigurable circuit. Method 10 enables reconfigurable graphene electronics that can be used for a wide variety of applications. For example, method 10 can be applied in neuromorphic/memristive architectures in which each unit cell has multiple electronic states of operation that each represent a different neural weight. Method 10's ability to dynamically change the electronic state of the GFET allows for adjustable gain, bandwidth, and matching in analog graphene circuits. The embodiment of method 10 shown in FIG. 1 comprises, consists of, or consists essentially of the following steps. One step $10_a$ provides for depositing a liquid dielectric over a graphene channel of the GFET. Another step $10_b$ provides for applying an activation energy via a first electric field across the liquid dielectric and the graphene channel to electrochemically produce chemical species within the liquid dielectric such that the chemical species (e.g. molecules, ions) accumulate at, and molecularly bond with, the graphene channel thereby decreasing a conductivity of the graphene channel. The chemical species accumulate at the graphene channel either via migration through the liquid dielectric or by being produced in close proximity to, or on, the graphene channel. Another step $10_c$ provides for applying a deactivation energy via a second electric field of opposite polarity to the first electric field to remove interaction (e.g., removing molecular bonds, transformation of a given chemical species into a different chemical species) between the chemical species and the graphene channel to increase the conductivity of the graphene channel. It is to be understood that steps $10_c$ and $10_b$ of method 10 may be performed in any desired order. For example, one can start with a deactivation energy followed by an activation energy, and vice versa. In other words, if the GFET is left in a state where the graphene channel has increased conductivity and one wants to decrease the conductivity then the activation step may be performed first. Alternatively, one could start from a scenario where the GFET is in a decreased conductivity state and the deactivation step may be performed.

Figure 2:
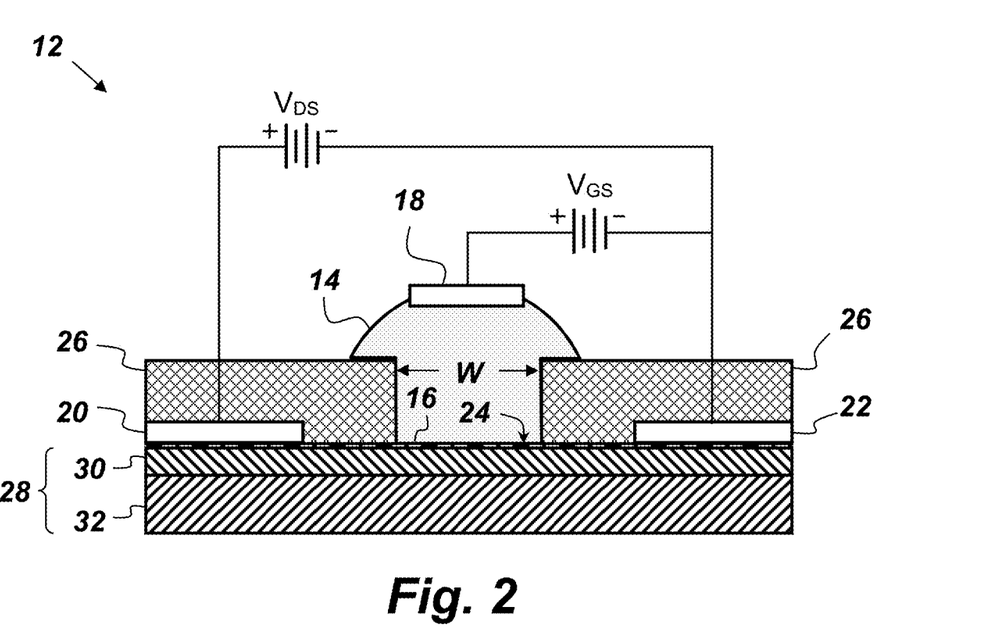
FIG. 2 is a cross-sectional view of an embodiment of a GFET.

FIG. 2 is a cross-sectional view of an illustration of an embodiment of a reconfigurable GFET 12. This embodiment of the GFET 12 comprises a liquid dielectric 14, a graphene channel 16, a gate electrode 18, a source electrode 20, and a drain electrode 22. The graphene channel 16 is disposed between the source electrode 20 and the drain electrode 22. In this embodiment, the graphene channel 16 has a width W of 100 micrometers (μm) and a length of 100 μm. (the length is not identified in FIG. 2 as it would be orthogonal to the cross-sectional view of the GFET 12 shown in FIG. 2) In some embodiments, it may be desirable for the graphene channel 16 to have a width that is shorter than 50 nanometers. In this embodiment, the liquid dielectric 14 is disposed on top of the graphene channel 16, and covers the entire graphene channel 16. The gate electrode 18 is disposed on the liquid dielectric 14. In this embodiment, the surface area of the gate electrode 18 that is in contact with the liquid dielectric 14 is at least as large as 75% of the surface area of the graphene channel 16 such that when a controlled voltage bias is applied to the gate electrode 18 electrochemical reactions are induced within the liquid dielectric 14 and portions of the graphene channel 16. The controlled voltage bias applied to gate electrode 18 forms a uniform EDL at a graphene-dielectric interface 24 and changes a majority of the graphene in the graphene channel 16 that is in contact with the liquid dielectric 14 into an ion-bonded material. In the embodiment of the GFET 12 shown in FIG. 2, the source electrode 20 and the drain electrode 22 are both made of gold (Au) encapsulated with a dielectric layer 26 (in this case alumina $Al_2O_3$) to allow the drain-to-source current to transport through the graphene channel 16 rather than electrically shorting through the liquid dielectric 14. Also in this embodiment, the graphene channel 16 is deposited on a silicon-on-insulator substrate 28, which in this case comprises a layer 30 of silicon dioxide ($SiO_2$) and a layer 32 of N++ Silicon (Si).

The liquid dielectric 16 may be any liquid, semi-solid, or gel having a dielectric constant greater than or equal to 30. Suitable examples of the liquid dielectric 16 include, but are not limited to, a polar organic compound, glycerin, and honey. As opposed to traditional electrostatic gating that utilizes an accumulation of charges from the dielectric to manipulate the conductivity of graphene, method 10 induces electrochemical reactions and/or electrostatic forces at or near the graphene-dielectric interface 24. An EDL forms at the graphene-dielectric interface 24 in the presence of an electric field. The composition of the liquid dielectric 14 determines the biasing voltages required, as well as the performance of the reconfigurable GFET 12. Additionally, liquid dielectrics can be modified (i.e. changing the pH, water content, etc.) to change the GFET properties. Method 10 may be utilized with any liquid-dielectric top-gated graphene device. Therefore, substrate and electrode materials can be varied. In another embodiment, suspended graphene can be utilized with a liquid dielectric biasing both the top and bottom layers. This approach may have an advantage due to control of reactions specifically with setting a stable potential and electric field with respect to the graphene layer.

Method 10 enables the control of the EDL via the high electric field, which in turn controls the amount of electrochemically produced ions that bond to or detach from the surface and/or edges of graphene 16. Similarly electrostatic forces may be significant enough to induce separation and affect rippling in graphene nanosheets or along fault boundaries between graphene crystals within the nanosheets. Some embodiments of method 10 may include surface-doping of sections of the graphene channel 16. However, it is to be understood that method 10 may be used to alter the conductivity of the graphene channel 16 without performing electron/hole doping of the graphene channel 16. Surface-doping changes the electrical and physical properties of the sections of the graphene channel 16 where applied, which enables non-volatile, reversible programming of the electrical transport and optical properties of the graphene. Intermediate doping states can be achieved as well, which act as discrete, programmable electronic states. Method 10 enables reconfigurable graphene devices with controllable carrier mobility, OFF resistance, and ON resistance. Method 10 may be applied to a plethora of applications including, but not limited to, neuromorphic/memristive technologies, adjustable analog graphene circuits, and tunable photodetectors and emitters. Memristors with multiple analog states can store memory and perform computations (a.k.a. in-memory computing). Additionally, memristors enable neuromorphic approaches within hardware. Neuromorphic architectures have shown to provide significant benefits in learning-based applications (i.e. neural networks). Method 10 results in a reconfigurable GFET having an increased ON-OFF ratio as compared to the ON-OFF ratios of previous graphene devices. For example, in one embodiment, method 10 has resulted in a reconfigurable GFET with an ON-OFF Ratio of $>10^4$, which is sufficient for usage in digital logic.

In one embodiment, the step $10_b$ of applying an activation energy may involve applying a voltage bias for a period of time until the EDL at the graphene-dielectric interface (e.g., interface 24 shown in FIG. 2) is strong enough to separate the chemical species based on their polarity and to provide the activation energy to produce weak molecular bonds between the chemical species and the graphene channel (such as the graphene channel 16). Inherently, any voltage may be sufficient to move the charged particle, but it needs to be high so that it is rapid enough to be relevant on our time scales (e.g., <10 s). This movement in liquid would be dependent on the ions and the liquid properties. The quantity of the molecular bonds may be altered by adjusting the voltage and polarization of the voltage bias to dynamically set a degree of electrical conductivity of the graphene channel such that the GFET exhibits ON-OFF ratios larger than $10^4$ with OFF-resistances as high as 10 MΩ, which enables reversible programming of the electrical conductance of the graphene channel. The voltage bias and the time period during which the voltage bias is applied may be altered to change carrier mobility and transconductance thereby enabling the reconfigurable graphene circuit to be used as a tunable analog circuit. The step of applying the activation energy may also involve manipulating a property of the liquid dielectric (e.g., pH, ionic strength, etc.) in lieu of, or in addition to, applying a voltage bias to the gate electrode.

In one embodiment of the method 10, application of the voltage bias results in a water-based electrochemical reaction that produces, via H+ reduction, hydrogen molecules that accumulate on, and molecularly bond to, the graphene channel such that portions of the graphene channel are molecularly altered to graphane. The inventors' measurements during performance of this embodiment of method 10 indicate that hydrogen molecules are forming C—H bonds at the surface of graphene and hydrogenating graphene. Hydrogenation of graphene produces something closer to graphane, which is an insulator rather than a metal. Our electrical transport measurements showed SET resistivities in the same range (~mega Ω) as the measured resistivity of graphane. When hydrogen ($H_2$) is generated from H+ ions, electrochemically, the $H_2$ can alter the properties of the graphene. This $H_2$ can be consumed at the electrode surface (in this case the graphene surface) by being oxidized and converted back to H+ ions.

Figure 3:
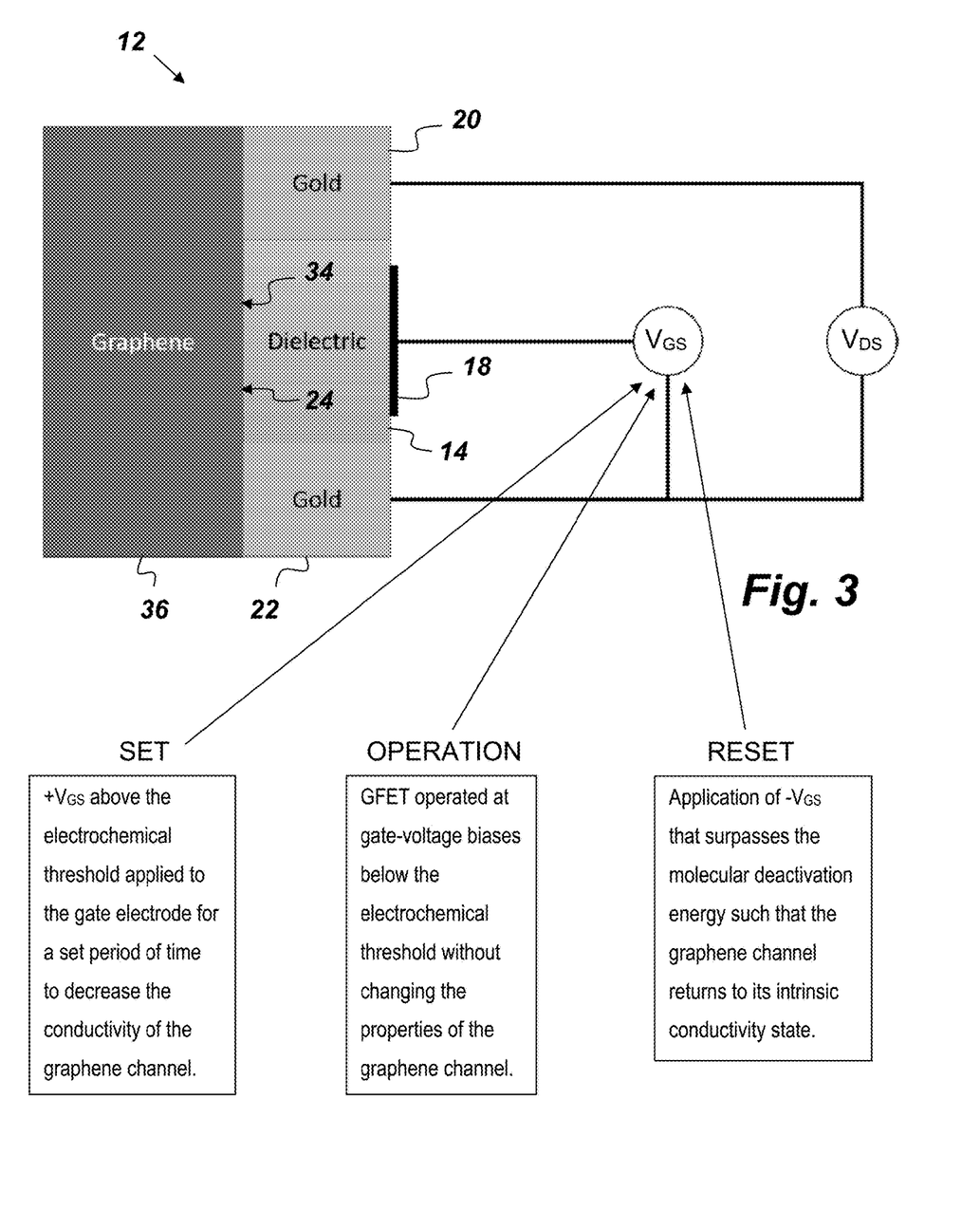
FIG. 3 is a cross-sectional view of an embodiment of a GFET.

FIG. 3 is a two-dimensional, cross-sectional view of an embodiment of a GFET 12 that may be used in conjunction with method 10. One embodiment of method 10, in reference to FIG. 3, may be summarized as follows. First, a voltage ($V_{GS}$) is applied to the gate electrode 18. If the voltage exceeds an electrochemical threshold, electrochemical reactions will occur at the gate electrode 18, at the drain and source electrodes 20 and 22 respectively, or at the graphene surface 34. Next, the electrochemically produced molecules/ions will align along the EDL formed between the graphene 36 and liquid dielectric 14. These molecules/ions may also be formed on the graphene surface 34. During a SET step, if the voltage at the liquid dielectric 14 is above the electrochemical threshold, the produced molecules/ions at the graphene-dielectric interface 24 can interact with the graphene 36 and change the properties of the graphene 36. This could include incorporation of the molecules/ions into the graphene 36 or simple electrostatic interaction at the graphene surface 34. Depending on the time that $V_{GS}$ is applied, this can determine what level of electrochemical doping occurs to the graphene 36. In other words, method 10 may be used to set intermediate doping levels by varying the $V_{GS}$ pulse time. Next, at this point, the GFET 12 can be operated at gate-voltage biases below the electrochemical threshold without changing the properties (i.e. mobility, absorption, off conduction) of the GFET 12. During a RESET step, if the voltage $V_{GS}$ at the liquid dielectric 14 reaches a threshold of opposite polarity and surpasses the molecular deactivation energy, the weak bonds at the graphene-EDL interface 24 will dissociate, and the graphene 36 will return to its intrinsic state.

Figure 4:
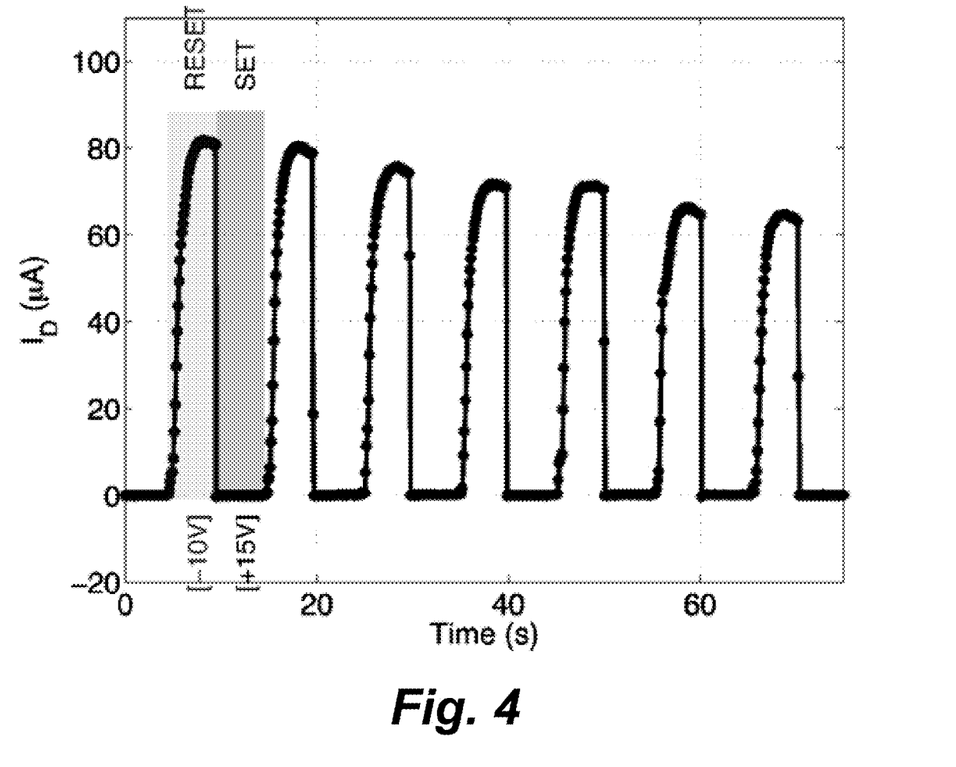
FIG. 4 is a data plot.
Figure 5:
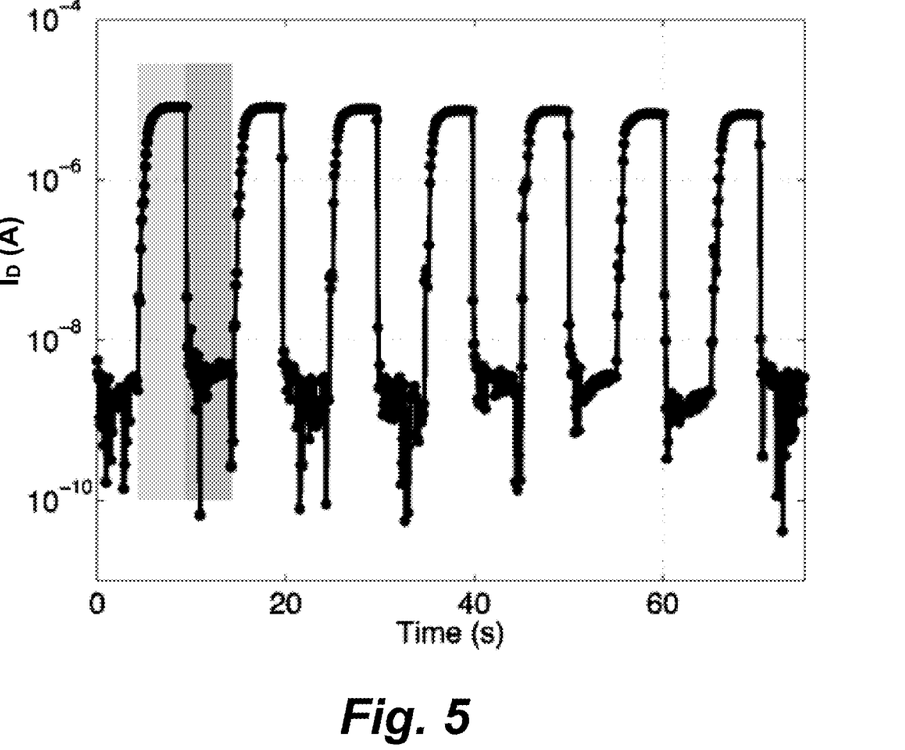
FIG. 5 is a data plot.

FIGS. 4 and 5 are plots of the transient switching response over time of an embodiment of the GFET 12 such as shown in FIG. 3. FIG. 4 represents the response of an electrolytic, top-gated GFET with honey as the liquid dielectric, where the SET bias voltage of +15V and the RESET bias voltage of −10V were used with 0.5 Hz switching. FIG. 5 represents the transient switching response of the electrolytic, top-gated GFET with honey as the liquid dielectric with log-formatted drain current with 0.5 Hz switching. FIGS. 4 and 5 show binary reconfigurability (saturated doping vs. no doping) of GFETs that may be achieved with method 10.

Figure 6:
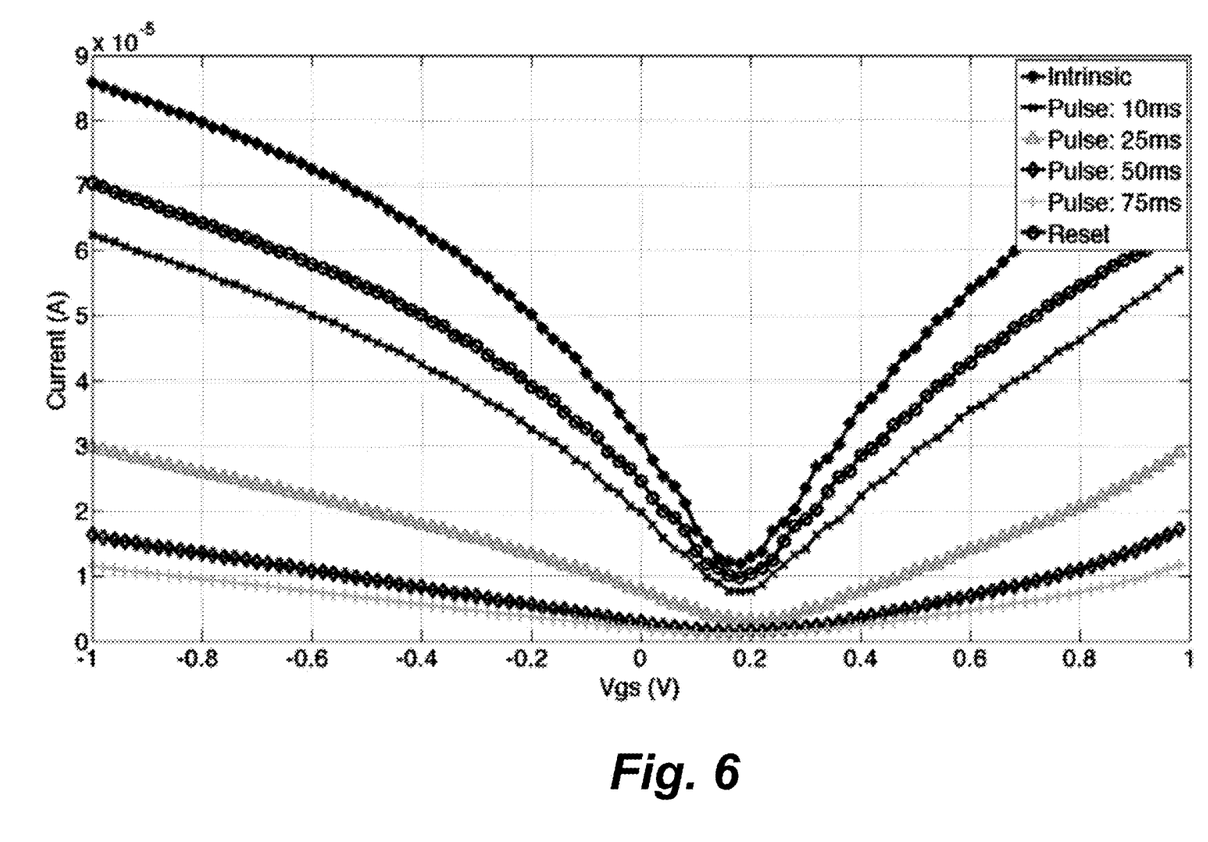
FIG. 6 is a data plot.

FIG. 6 is a plot showing reconfigurable GFET transfer curves with varying $V_{GS}$ pulse duration. The results shown in FIG. 6 illustrate how method 10 may be used to achieve intermediate doping states of graphene by utilizing the operation steps of an embodiment of method 10. In this particular embodiment, we used SET $V_{GS}$ pulses of varying duration (annotated in legend) to vary the amount of doping of the GFET 12. Then, we operated the GFET 12 within the electrochemical thresholds to avoid redoping the GFET 12. As shown in the results, the mobility (~slope of the curve), ON current, and OFF current all change with electrochemical doping, which allows for more design flexibility. Method 10 results in the creation of a bandgap in graphene, which offers a significantly larger tuning range over previous methods that employ electrostatically doping graphene to screen low-energy photons and tune the optoelectronic performance of a graphene device via Pauli blocking. The "Reset" data-line shows the electrical response after using a RESET $V_{GS}$ pulse (opposite polarity of the SET $V_{GS}$ pulse) of 75 ms. Further, method 10 allows for ultra-low power GFET operation by changing the pH of the liquid dielectric, and thereby changing the threshold (SET/RESET) voltages.

Figure 7:
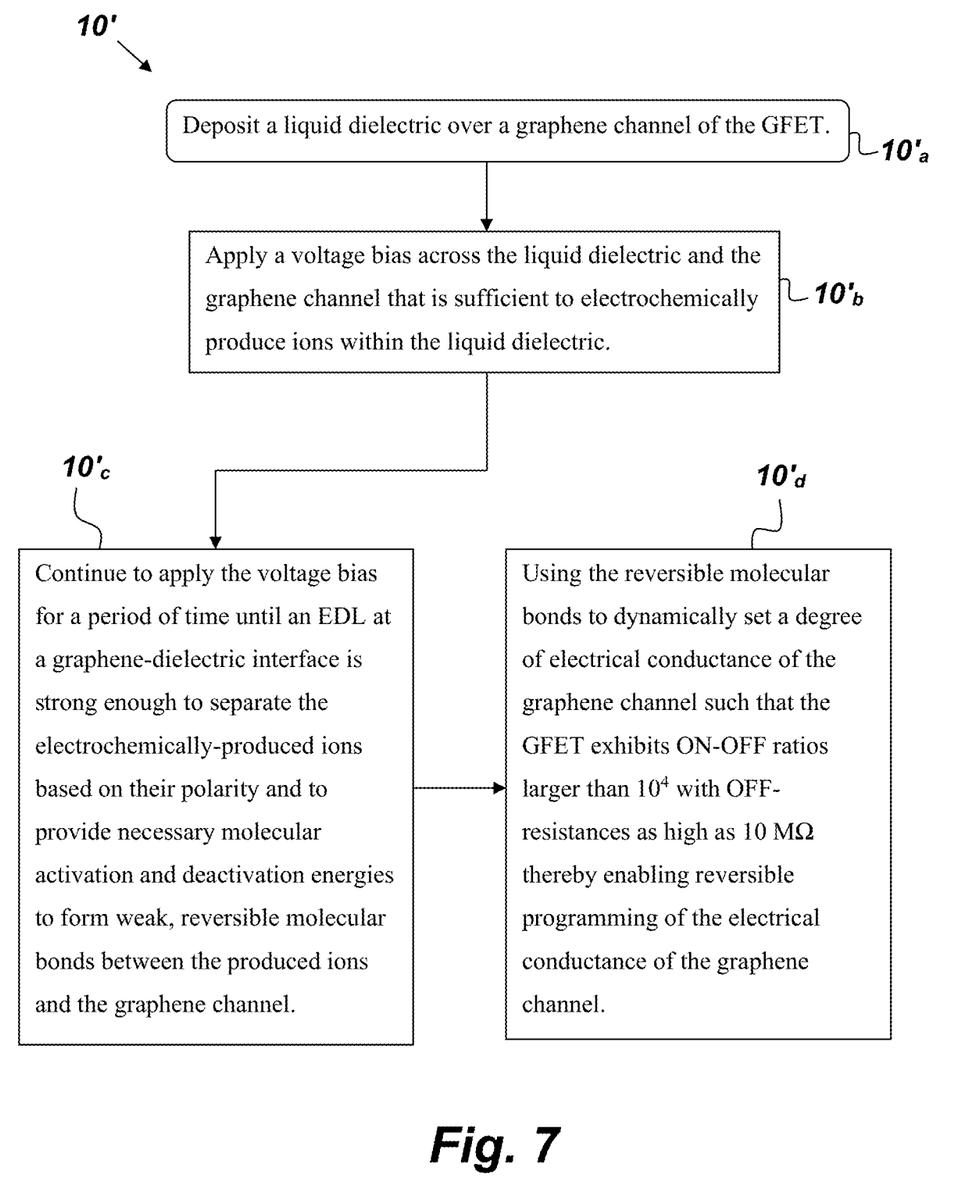
FIG. 7 is a flowchart of an embodiment of a method for using a GFET as a reconfigurable circuit.

FIG. 7 is a flowchart of an embodiment of method 10 that will referred to hereafter as method 10', which is embodied by the following steps. The first step $10'_a$ provides for depositing a liquid dielectric over a graphene channel of a GFET. Another step $10'_b$ provides for applying a voltage bias across the liquid dielectric and the graphene channel that is sufficient to electrochemically produce ions within the liquid dielectric. Another step $10'_c$ provides for continuing to apply the voltage bias for a period of time until an EDL at a graphene-dielectric interface is strong enough to separate the electrochemically-produced ions based on their polarity and to provide necessary molecular activation and deactivation energies to form weak, reversible molecular bonds between the produced ions and the graphene channel. Another step $10'_d$ provides for using the reversible molecular bonds to dynamically set a degree of electrical conductance of the graphene channel such that the GFET exhibits ON-OFF ratios larger than $10^4$ with OFF-resistances as high as 10 MΩ thereby enabling reversible programming of the electrical conductance of the graphene channel.

Method 10' results in a reconfigurable graphene circuit such as nonvolatile memory that maintains fixed conductivity properties after biasing. The nonvolatile memory may be set with the voltage bias by changing the degree of conductance of the graphene channel. Method 10 and 10' may further comprise the step of altering the voltage bias or the period of time or both to set the graphene channel to an intermediate conductance state that is between a fully conductive and an insulative state thereby enabling a nonvolatile, intermediate memory state without changing a chemical composition of the EDL. For example, the nonvolatile, intermediate memory state may be characterized by a 50% conductance of the graphene channel. Method 10' may also include a RESET step that comprises applying a voltage bias of opposite polarity to the voltage bias that triggered production of the electrochemically-produced ions such that weakly-bound ions on the graphene channel are released or electrochemically changed and redistributed in the dielectric liquid. Varying acidity and alkalinity states across the surface of the graphene may also be useful in patterning unique devices and topologies.

Method 10 involves a novel use of the graphene layer as an electrode surface for performing chemical reactions. Method 10 is able to dynamically achieve intermediate conductivity states of the GFET without microfluidics and without changing the chemical composition of the EDL. Lower gate-voltage biases will allow for improved device repeatability with slower operation, while larger gate voltage biases will provide low-repeatability devices with faster switching speeds.

From the above description of the method 10 for using a GFET as a reconfigurable circuit, it is manifest that various techniques may be used for implementing the concepts of method 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that method 10 is not limited to the particular embodiments described herein, but is capable of many embodiments without departing from the scope of the claims.

We claim:

1. A method for using a graphene field-effect transistor (GFET) as a reconfigurable circuit, the method comprising the following steps:
   depositing a liquid dielectric over a graphene channel of the GFET;
   applying an activation energy via a first electric field across the liquid dielectric and the graphene channel to electrochemically produce chemical species within the liquid dielectric such that the chemical species accumulate at, and molecularly bond with, the graphene channel thereby decreasing a conductivity of the graphene channel; and
   applying a deactivation energy via a second electric field of opposite polarity to the first electric field to remove interaction between the chemical species and the graphene channel to increase the conductivity of the graphene channel.

2. The method of claim 1, wherein the conductivity of the graphene channel is altered without performing electron/hole doping of the graphene channel.

3. The method of claim 2, wherein the step of applying an activation energy further comprises:
   applying a voltage bias for a period of time until an electrical double layer (EDL) at a graphene-dielectric interface is strong enough to separate the chemical species based on their polarity and to provide the activation energy to produce weak molecular bonds between the chemical species and the graphene channel.

4. The method of claim 2, wherein the step of applying an activation energy further comprises: altering a pH of the liquid dielectric.

5. The method of claim 3, further comprising the step of altering a quantity of the molecular bonds by adjusting a voltage and polarization of the voltage bias to dynamically set a degree of electrical conductivity of the graphene channel such that the GFET exhibits ON-OFF ratios larger than $10^4$ with OFF-resistances as high as 10 MΩ thereby enabling reversible programming of the electrical conductance of the graphene channel.

6. The method of claim 5, further comprising altering the voltage bias and the time period to change carrier mobility and transconductance thereby enabling the reconfigurable graphene circuit to be used as a tunable analog circuit.

7. The method of claim 5, wherein the chemical species comprise hydrogen molecules that accumulate on, and molecularly bond to, the graphene channel such that portions of the graphene channel are molecularly altered to graphane.

8. A method for providing a reconfigurable graphene circuit, the method comprising the following steps:
   depositing a liquid dielectric over a graphene channel of a graphene field-effect transistor (GFET);
   applying a voltage bias across the liquid dielectric and the graphene channel that is sufficient to electrochemically produce ions within the liquid dielectric;
   continuing to apply the voltage bias for a period of time until an electrical double layer (EDL) at a graphene-dielectric interface is strong enough to separate the electrochemically-produced ions based on their polarity and to provide necessary molecular activation and deactivation energies to form weak, reversible molecular bonds between the produced ions and the graphene channel; and
   using the reversible molecular bonds to dynamically set a degree of electrical conductance of the graphene channel such that the GFET exhibits ON-OFF ratios larger than $10^4$ with OFF-resistances as high as 10 MΩ thereby enabling reversible programming of the electrical conductance of the graphene channel.

9. The method of claim 8, wherein a gate electrode is deposited on the liquid dielectric and wherein a surface area of the gate electrode is at least as large as 75% of a surface area of the graphene channel such that when the controlled voltage bias is applied to the gate electrode electrochemical reactions are induced within the dielectric layer and portions of the graphene channel changing a majority of the graphene into a chemically-bonded material and forming a uniform electrical double layer at a graphene-dielectric interface.

10. The method of claim 8, wherein the reconfigurable graphene circuit is nonvolatile memory that maintains fixed electrical transport (conductivity, transconductance, carrier mobility) properties after biasing.

11. The method of claim 10, further comprising resetting the nonvolatile memory with the voltage bias by changing the degree of conductance of the graphene channel.

12. The method of claim 10, further comprising altering the voltage bias or the period of time or both to set the graphene channel to an intermediate conductance state that is between a fully conductive and an insulative state thereby enabling a nonvolatile, intermediate memory state without changing a chemical composition of the EDL.

13. The method of claim 12, wherein the nonvolatile, intermediate memory state is characterized by a 50% conductance of the graphene channel.

14. The method of claim 13, wherein the liquid dielectric is selected from the group consisting of: a polar organic compound, glycerin, and honey.

15. The method of claim 8, wherein the graphene channel has a width that is shorter than 100 micrometers and a length that is shorter than 100 micrometers.

16. The method of claim 8, wherein the reconfigurable graphene circuit is an electrical switch.

17. The method of claim 8, further comprising a RESET step that comprises applying a voltage bias of opposite polarity to the voltage bias that triggered production of the electrochemically-produced ions such that weakly-bound ions on the graphene channel are released or electrochemically changed and redistributed in the dielectric liquid.

18. A reconfigurable graphene field-effect transistor (GFET) comprising:
 a graphene channel disposed between source and drain electrodes;
 a liquid dielectric disposed on top of the graphene channel; and
 a gate electrode disposed on the liquid dielectric, wherein a surface area of the gate electrode is at least as large as 75% of the surface area of the graphene channel such that when a controlled voltage bias is applied to the gate electrode electrochemical reactions are induced within the liquid dielectric and portions of the graphene channel changing a majority of the graphene into an ion-bonded material and forming a uniform electrical double layer at a graphene-dielectric interface.

19. The reconfigurable GFET of claim 18, wherein the liquid dielectric has a dielectric constant greater than or equal to 30.

20. The reconfigurable GFET of claim 19, wherein the graphene channel has a width that is shorter than 50 nanometers.

* * * * *